United States Patent [19]
Kai

[11] Patent Number: 6,104,627
[45] Date of Patent: Aug. 15, 2000

[54] SEMICONDUCTOR MEMORY DEVICE

[75] Inventor: Yasukazu Kai, Miyazaki, Japan

[73] Assignee: Oki Electric Industry Co., Ltd., Tokyo, Japan

[21] Appl. No.: 08/967,235

[22] Filed: Nov. 5, 1997

Related U.S. Application Data

[63] Continuation of application No. 08/814,881, Mar. 12, 1997, abandoned.

[30] Foreign Application Priority Data

Apr. 23, 1996 [JP] Japan ................................. 8-101053

[51] Int. Cl.$^7$ ...................................................... G11C 5/02
[52] U.S. Cl. ............................... 365/51; 365/63; 365/226
[58] Field of Search ............................. 365/230.03, 226, 365/51, 63, 72

[56] References Cited

U.S. PATENT DOCUMENTS

| | | | |
|---|---|---|---|
| 5,231,607 | 7/1993 | Yoshida | 365/226 |
| 5,293,334 | 3/1994 | Shimizu | 365/51 |
| 5,293,559 | 3/1994 | Kim et al. | 365/63 |
| 5,321,646 | 6/1994 | Tomishima | 365/51 |
| 5,321,658 | 6/1994 | Ishimura et al. | 365/206 |
| 5,422,853 | 6/1995 | Miyamoto | 365/205 |
| 5,535,152 | 7/1996 | Han | 365/51 |
| 5,604,710 | 2/1997 | Tomishima | 365/230.03 |

*Primary Examiner*—Son Mai
*Attorney, Agent, or Firm*—Venable; Robert J. Frank; Michael A. Sartori

[57] ABSTRACT

The present invention relates to a semiconductor memory device having a memory cell array of a split-operation mode.

The semiconductor memory device comprises a semiconductor chip having first through fourth sides, a first interconnection disposed along the first side of the semiconductor chip and supplied with a source potential level or a ground potential level, a second interconnection disposed along the second side opposed to the first side and supplied with the source potential level or the ground potential level, and a plurality of sub-array regions disposed between the first interconnection and the second interconnection. A plurality of memory cells and a plurality of sense amplifiers respectively connected to the memory cells are disposed in each of the sub-array regions. The memory cells and the sense amplifiers disposed in one of the sub-array regions are activated in response to the potential level supplied to the first interconnection. The memory cells and the sense amplifiers disposed in another one of the sub-array regions are activated substantially simultaneously with the memory cells and the sense amplifiers disposed in the above one of the sub-array regions in response to the potential level supplied to the second interconnection.

18 Claims, 13 Drawing Sheets

SEMICONDUCTOR MEMORY DEVICE

This application is a continuation of application Ser. No. 08/814,881, filed Mar. 12. 1997, abandoned.

BACKGROUND OF THE INVENTION

1. Field of the Invention

This invention relates to a semiconductor memory device, and particularly to a dynamic random access memory (DRAM) having a memory cell array of a split-operation mode.

2. Description of the Related Art

The following example has heretofore been known as a technique employed in such a field.

FIG. 3 is a view showing the configuration of a conventional semiconductor memory device of a block-splitting mode. FIG. 4 is an enlarged view of an A portion shown in FIG. 3. FIG. 5 is a view illustrating a sense amplifier train of the conventional semiconductor memory device shown in FIG. 3.

In general, a large-capacity DRAM has a memory array provided so as to be divided into four sub-array regions by X decoders and Y decoders. Sub-array regions 10 and 11 are disposed on the upper half side of a chip, whereas sub-array regions 12 and 13 are disposed on the lower half side of the chip. X decoders are respectively disposed within regions 14 defined between the two. The sub-array regions 10 and 13 are disposed on the left half side of the chip and the sub-array regions 11 and 12 are disposed on the right half side of the chip. Y decoders are respectively disposed within regions 15 defined between the two. Each of the sub-array regions comprises a plurality of cell array regions 23. A plurality of memory cells, a plurality of bit line pairs 26 and a plurality of word lines are disposed within each of the cell array regions 23.

As shown in FIG. 5, sense amplifier trains 24 each composed of a plurality of sense amplifier circuits 21 and a sense latch circuit 22 are respectively provided on both sides of the respective cell array regions 23 of the sub-array regions as seen in the left and right directions. Incidentally, each sense latch circuit 22 has an NMOS transistor 22A and a PMOS transistor 22B. The gates of both transistors are respectively controlled by sense latch signals 25 each having a positive phase and an opposite phase.

Source wires or interconnections 16, 17, 18 and 19 respectively electrically connected to the plurality of sense amplifier trains 24 are disposed so as to surround the sub-array regions. The source interconnections 16 and 17 are principally used for the plurality of sense amplifier trains 24 in the sub-array regions 10 and 11 provided on the upper half side of the chip, whereas the source interconnections 18 and 19 are principally used for the plurality of sense amplifier trains 24 in the sub-array regions 12 and 13 provided on the lower half side of the chip.

When the four sub-array regions 10, 11, 12 and 13 are divisionally operated, the sub-array regions 10 and 11 on the upper half side have heretofore been activated simultaneously as blocks A and the sub-array regions 12 and 13 on the lower half side have heretofore been activated simultaneously as blocks B in timing different from that for the blocks A. In the way of such block division or splitting, however, circuits used as noise sources have been biased toward upper or lower power sources.

Namely, when each block A is activated (i.e., when memory cells in the block A are selected), a plurality of cell arrays of each of the sub-array regions 10 and 11 are simultaneously activated (selected) and the sense amplifier trains 24 on both sides thereof are also activated (a sense latch operation is performed). When the PMOS transistor 22B and the NMOS transistor 22A are turned on so that a source interconnection supplied with a power source potential Vdd (e.g., 5V) and its corresponding sense amplifiers SA are electrically connected to one another and a source interconnection supplied with a ground potential Gnd (e.g., 0V) and its corresponding sense amplifiers SA are electrically connected to one another, each sense amplifier train 24 is activated as shown in FIG. 6.

When each sense amplifiers SA is activated, electric charges are charged or discharged between the source interconnections and each sense amplifier SA to amplify information stored in each memory cell, which has been transferred to each bit line pair 26 (the arrows show the manner of charge or discharge).

However, since the plurality of activated sense amplifier trains 24 are biased toward the source interconnections 16 and 17 as shown in FIG. 7, high noise occurs in the source interconnections 16 and 17 (since the blocks B are not activated on the other hand, no noise is produced in the source interconnections 18 and 19). The speed of amplifying information by each sense amplifier SA becomes slow under the influence of the noise and the semiconductor memory device will eventually lead to a slow operating speed. Therefore, there has been a demand for the improvement in the operating speed of the semiconductor memory device.

SUMMARY OF THE INVENTION

With the foregoing in view, it is an object of the present invention to disperse sense amplifiers and memory cells to be activated.

It is another object of the present invention to disperse or reduce noise produced in interconnections each supplied with a source potential level or a ground potential level.

It is a further object of the present invention to improve an operating speed of a sense amplifier.

It is a still further object of the present invention to provide a semiconductor memory device capable of providing an improvement in access speed.

According to one aspect of the present invention, for achieving the above objects, there is provided a typical semiconductor memory device of the present invention, comprising:

a semiconductor chip having first through fourth sides;

a first interconnection disposed along the first side of the semiconductor chip and supplied with a source potential level or a ground potential level;

a second interconnection disposed along the second side opposed to the first side and supplied with the source potential level or the ground potential level; and a plurality of sub-array regions disposed between the first interconnection and the second interconnection and each including a plurality of memory cells and a plurality of sense amplifiers respectively connected to the memory cells, both of which are disposed in each of the sub-array regions, a plurality of sense amplifiers respectively connected to the plurality of memory cells, the sense amplifiers being disposed in each sub-array region, the memory cells and the sense amplifiers disposed in one of the sub-array regions being activated in response to the potential level supplied to the first interconnection, the memory cells and the sense amplifiers disposed in another one of the sub-array regions being activated in response to the potential level supplied to the second interconnection substantially simultaneously with the memory cells and the sense amplifiers disposed in the one of the sub-array regions.

Here, typical ones of various inventions in the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
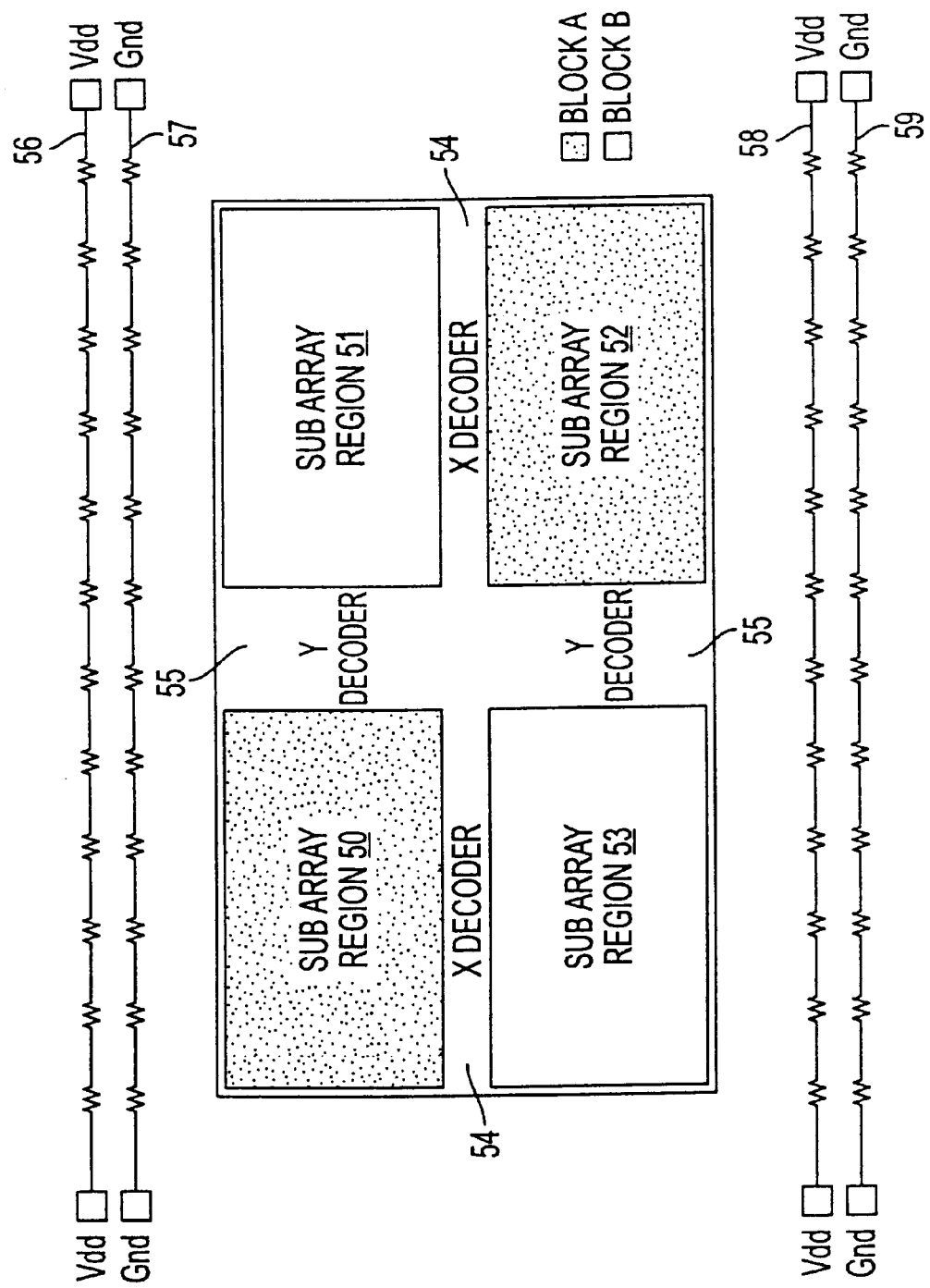
FIG. 1 is a view showing a semiconductor memory device according to a first embodiment of the present invention.
Figure 2:
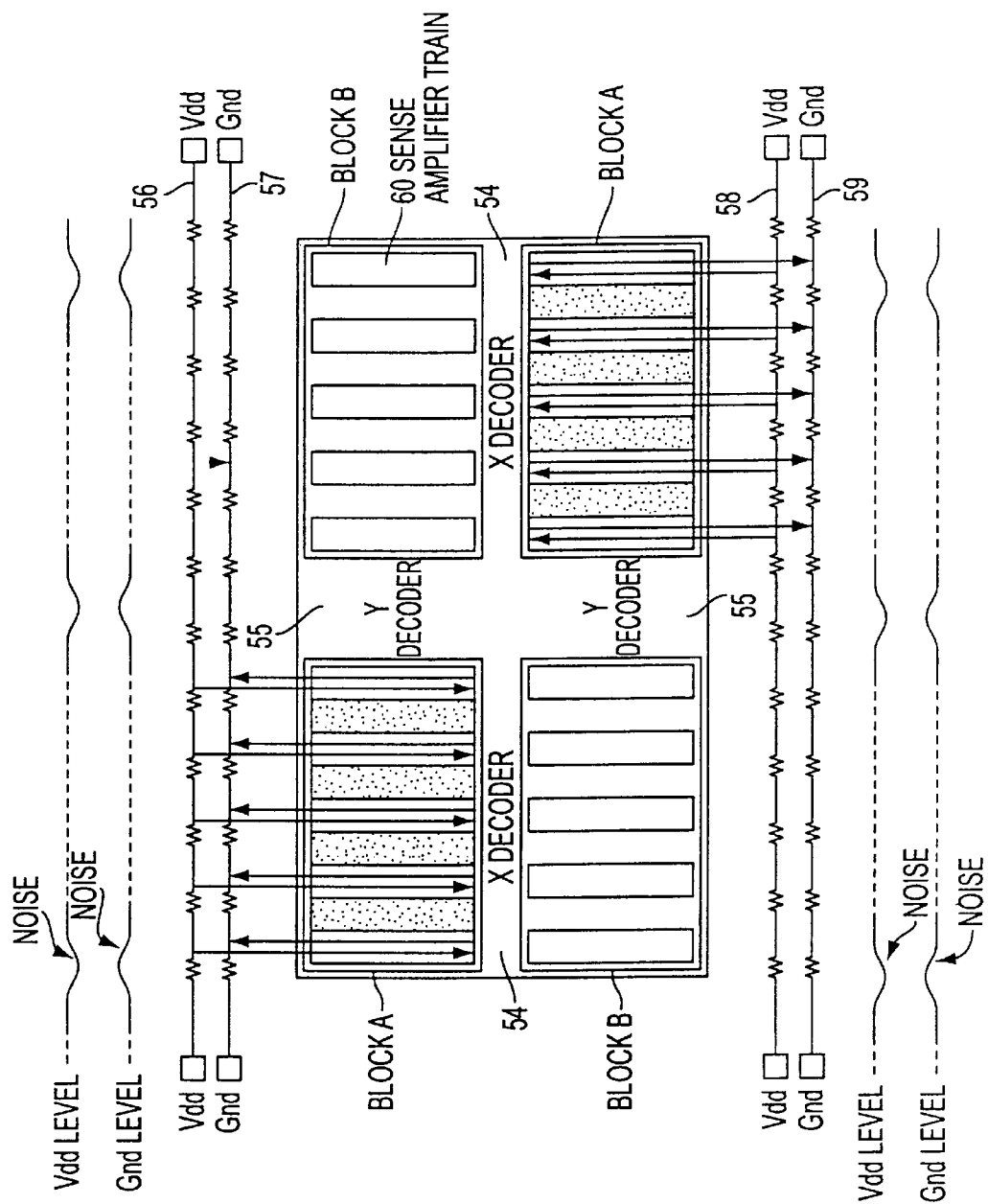
FIG. 2 is a view for describing the operation of the semiconductor memory device shown in FIG. 1.
Figure 3:
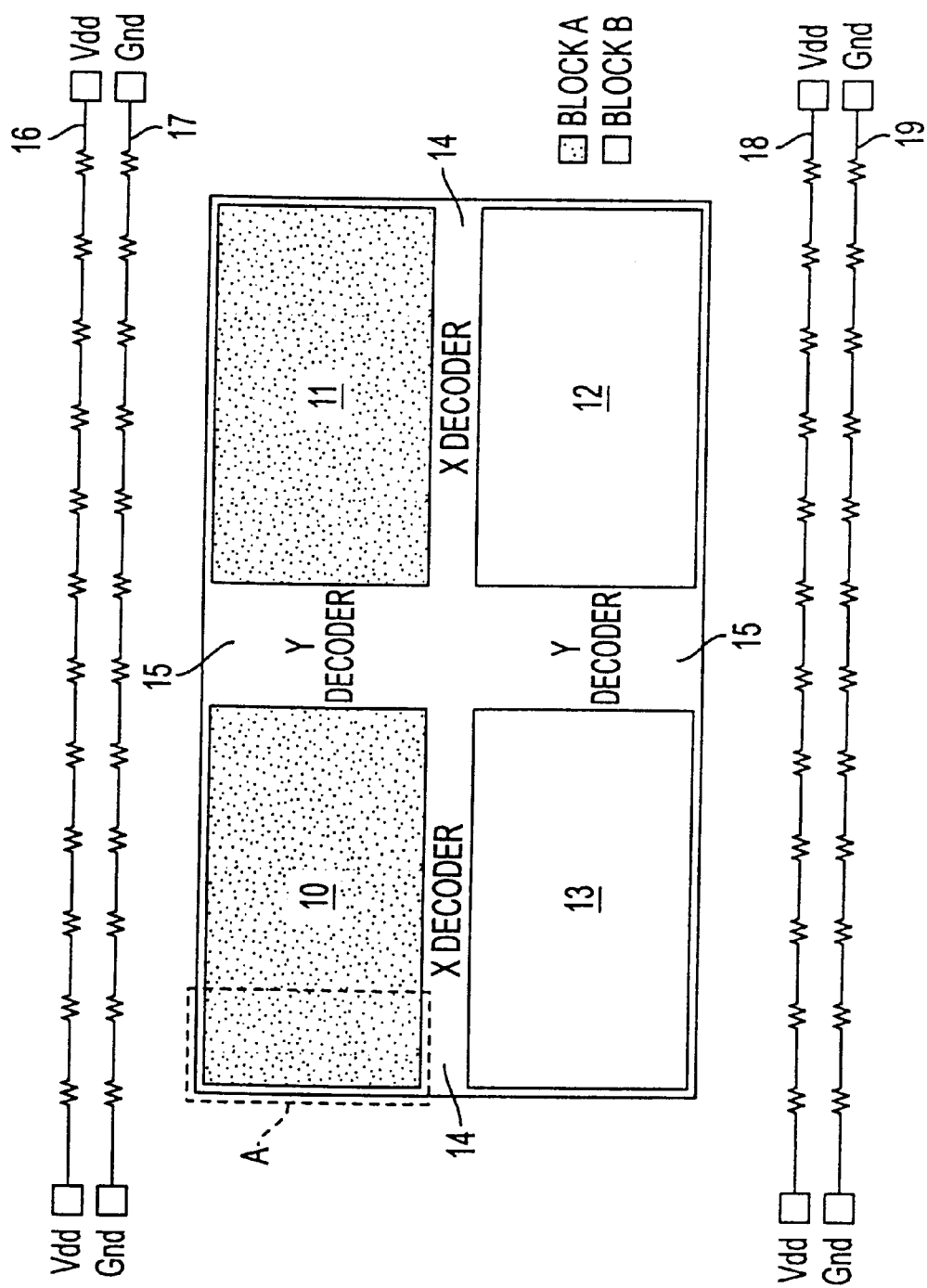
FIG. 3 is a view showing a conventional semiconductor memory device.
Figure 4:
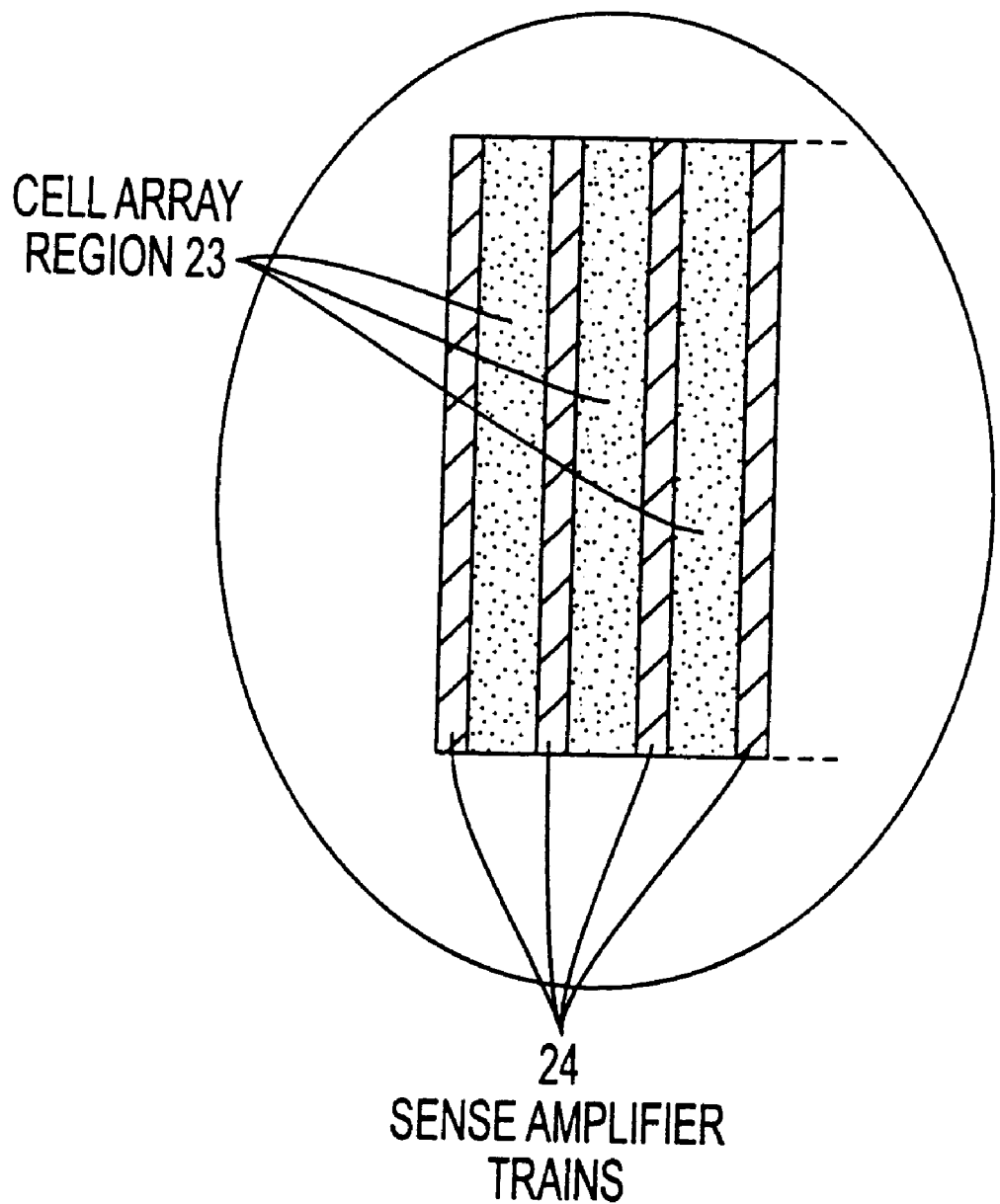
FIG. 4 is an enlarged view of an A portion shown in FIG. 3.

FIG. 1 is a view typically showing a block-splitting mode of a semiconductor memory device illustrating a first embodiment of the present invention. FIG. 2 is a view for describing the operation of the semiconductor memory device shown in FIG. 1.

As shown in these drawings, a memory cell array is divided into four sub-array regions by X and Y decoders.

Sub-array regions 50 and 51 are disposed on the upper half side of a chip and sub-array regions 52 and 53 are disposed on the lower half side of the chip. The X decoders are respectively provided in regions 54 defined between the upper sub-array regions 50 and 51 and the lower sub-array regions 52 and 53. The sub-array regions 50 and 53 are disposed on the left half side of the chip and the sub-array regions 51 and 52 are disposed on the right half side of the chip. The Y decoders are respectively disposed in regions 55 defined between the sub-array regions 51 and 52 on the right side of the chip and the sub-array regions 50 and 53 on the left side thereof.

Figure 5:
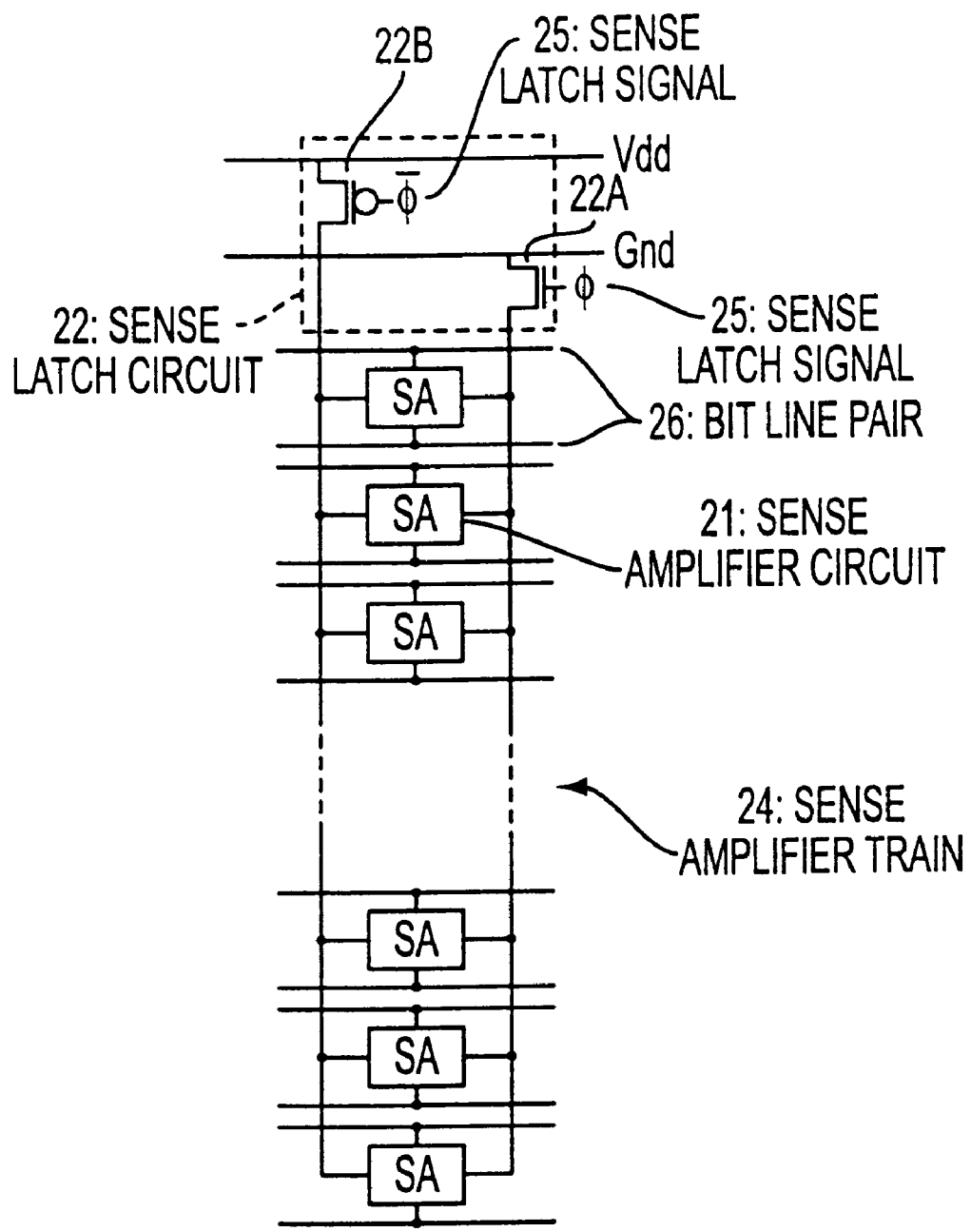
FIG. 5 is a view showing a sense amplifier train of the semiconductor memory device shown in FIG. 3.
Figure 6:
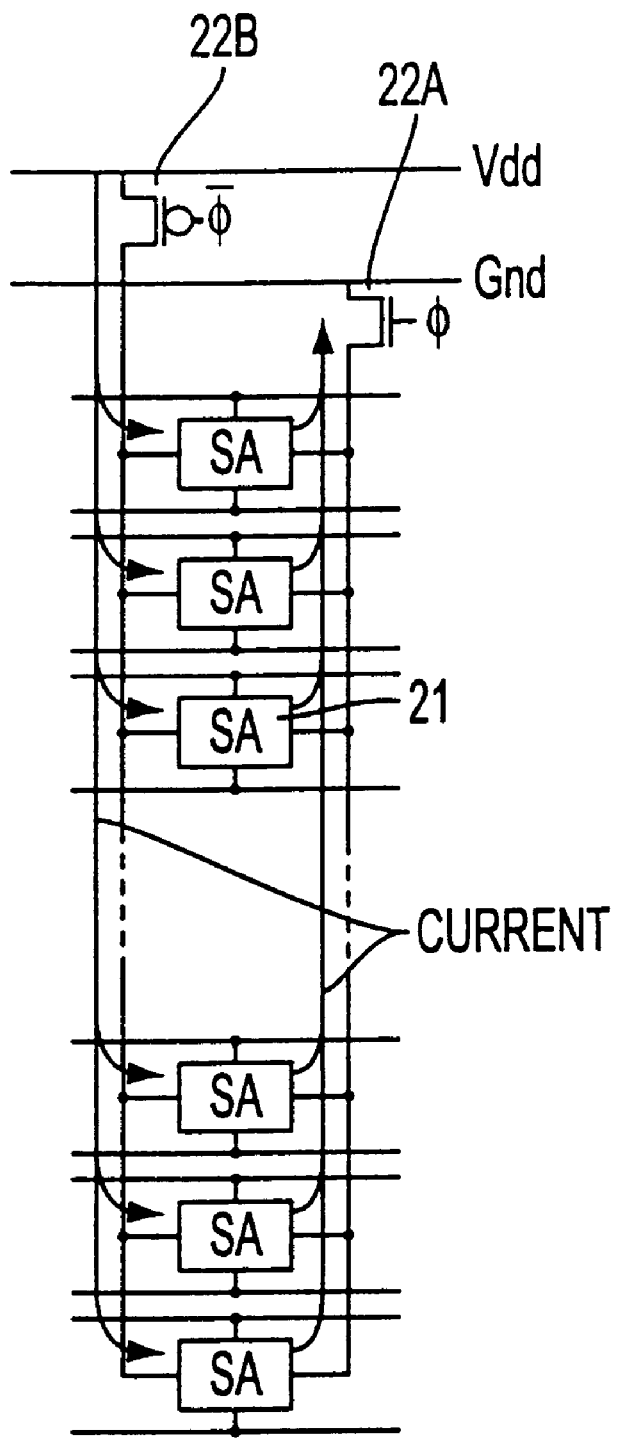
FIG. 6 is a view for describing current channels at the time of the operation of the semiconductor memory device shown in FIG. 3.

Each of the sub-array regions is composed of a plurality of cell array regions. A plurality of memory cells, a plurality of bit line pairs and a plurality of word lines are placed within each cell array region. As shown in FIG. 5 above, sense amplifier trains 24 (corresponding to sense amplifier trains 60 in FIG. 2) each composed of a plurality of sense amplifier circuits 21 and a sense latch circuit 22 are respectively provided on both sides of the respective cell array regions of the sub-array regions as seen in the left and right directions.

Source wires or interconnections 56, 57, 58 and 59 (corresponding to Vdd interconnections 56 and 58 and Gnd interconnections 57 and 59 in the present embodiment) respectively electrically connected to the plurality of sense amplifier trains 60 are disposed so as to surround the sub-array regions 50, 51, 52 and 53. The source interconnections 56 and 57 are principally used for the plurality of sense amplifier trains 60 in the sub-array regions 50 and 51 provided on the upper half side of the chip, whereas the source interconnections 58 and 59 are principally used for the plurality of sense amplifier trains 60 in the sub-array regions 52 and 53 provided on the lower half side of the chip.

In the first embodiment as described above, the sub-array regions 50 and 52 of the memory cell array are respectively defined as blocks A and the sub-array regions 51 and 53 thereof are respectively defined as blocks B to reduce power source noise produced inside the chip and speed up the amplification of each sense amplifier.

When the blocks A are activated, the plurality of cell array regions of the sub-array regions 50 and 52 are simultaneously activated and the sense amplifier trains provided on both sides of the cell array regions are also activated. When each sense amplifier train is activated (i.e., when a sense latch operation is performed), an electric charge is charged or discharged between each power source and each sense amplifier to allow the sense amplifier to amplify information stored in each memory cell, which has been transferred to a bit line pair. The present embodiment means that a specific cell (cell train) in each sub-array region is selected without all the cells in the respective sub-array regions being selected. This is similarly done even in the case of other embodiments.

Thus, in the block-splitting mode of the first embodiment, the simultaneously-activated sub-array regions are equally dispersed to the source interconnections 56 and 57 and source interconnections 58 and 59.

Since the simultaneously-activated sub-array regions are divided into the blocks in cross form as described above, the noise sources biased toward the upper or lower power source can be dispersed upwardly and downwardly on the left and right sides. It is thus possible to reduce noise as shown in FIG. 2 as compared with the prior art.

Thus, the speed of amplifying information by each sense amplifier can be made higher than ever. Eventually, access times to the chip can be made faster.

A second embodiment of the present invention will next be described.

Figure 8:
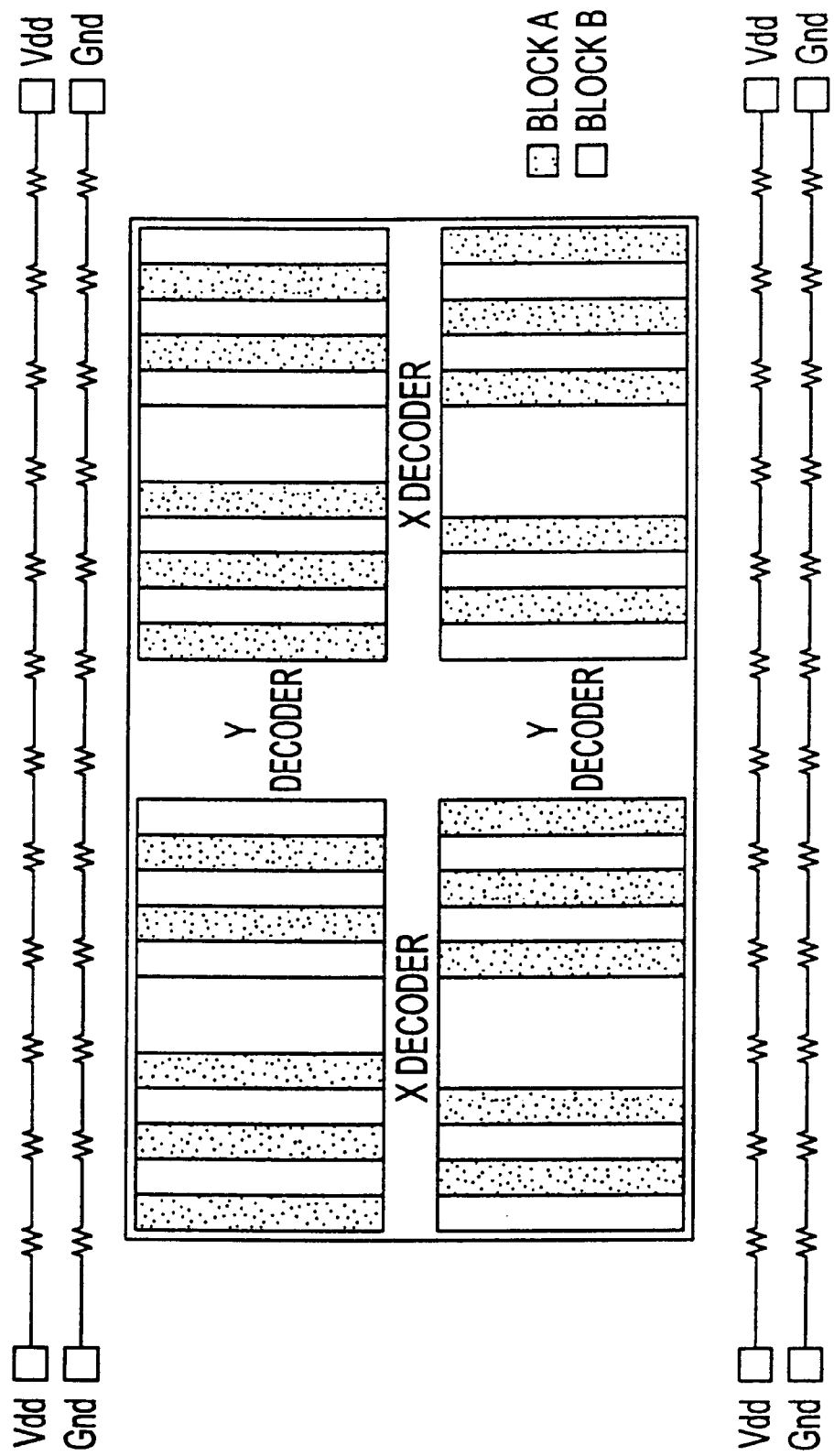
FIG. 8 is a view showing a semiconductor memory device according to a second embodiment of the present invention.

FIG. 8 is a view typically showing a block-splitting mode of a semiconductor memory device illustrative of the second embodiment of the present invention.

Figure 9:
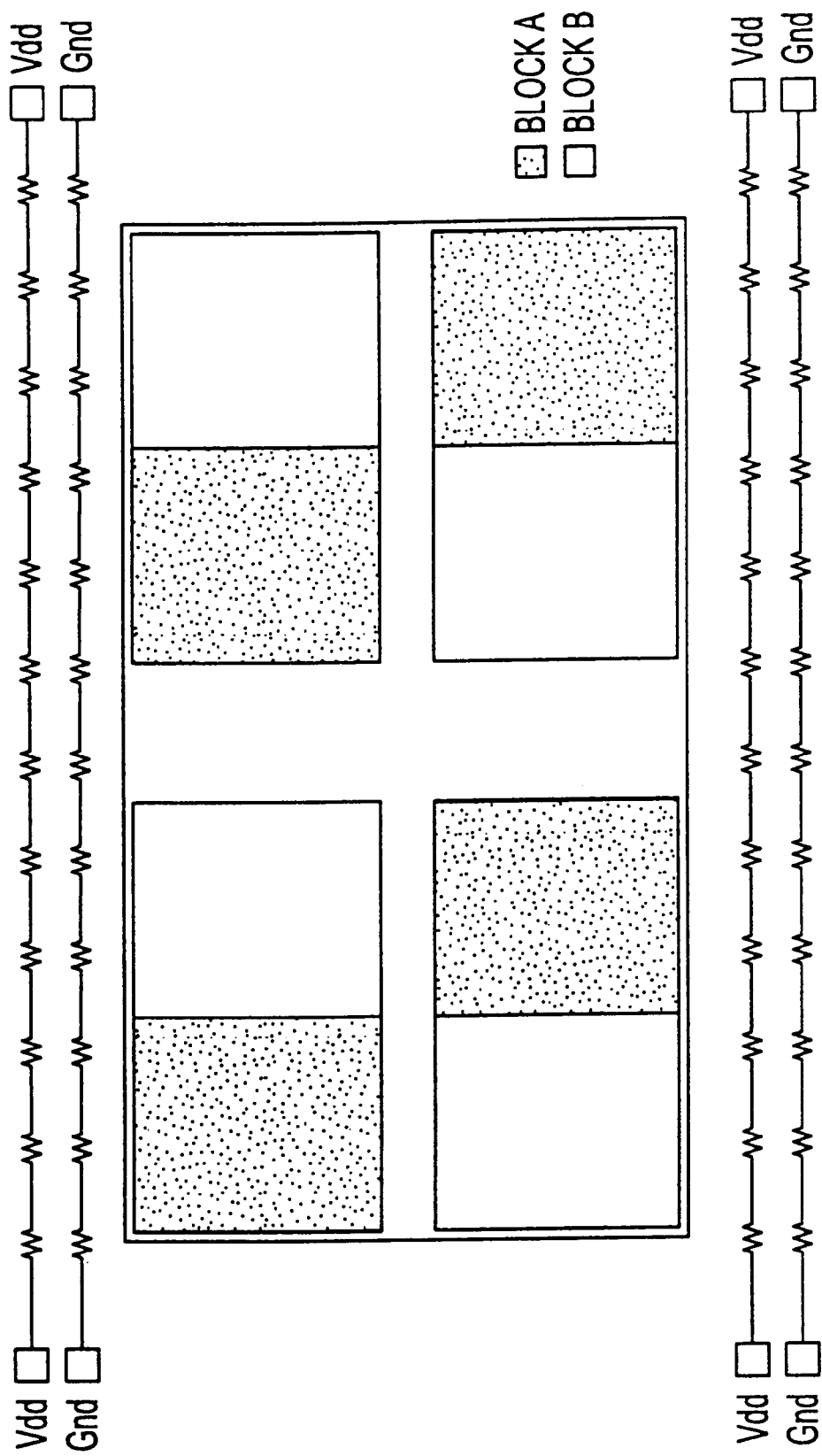
FIG. 9 is a view illustrating the semiconductor memory device shown in FIG. 8.
Figure 10:
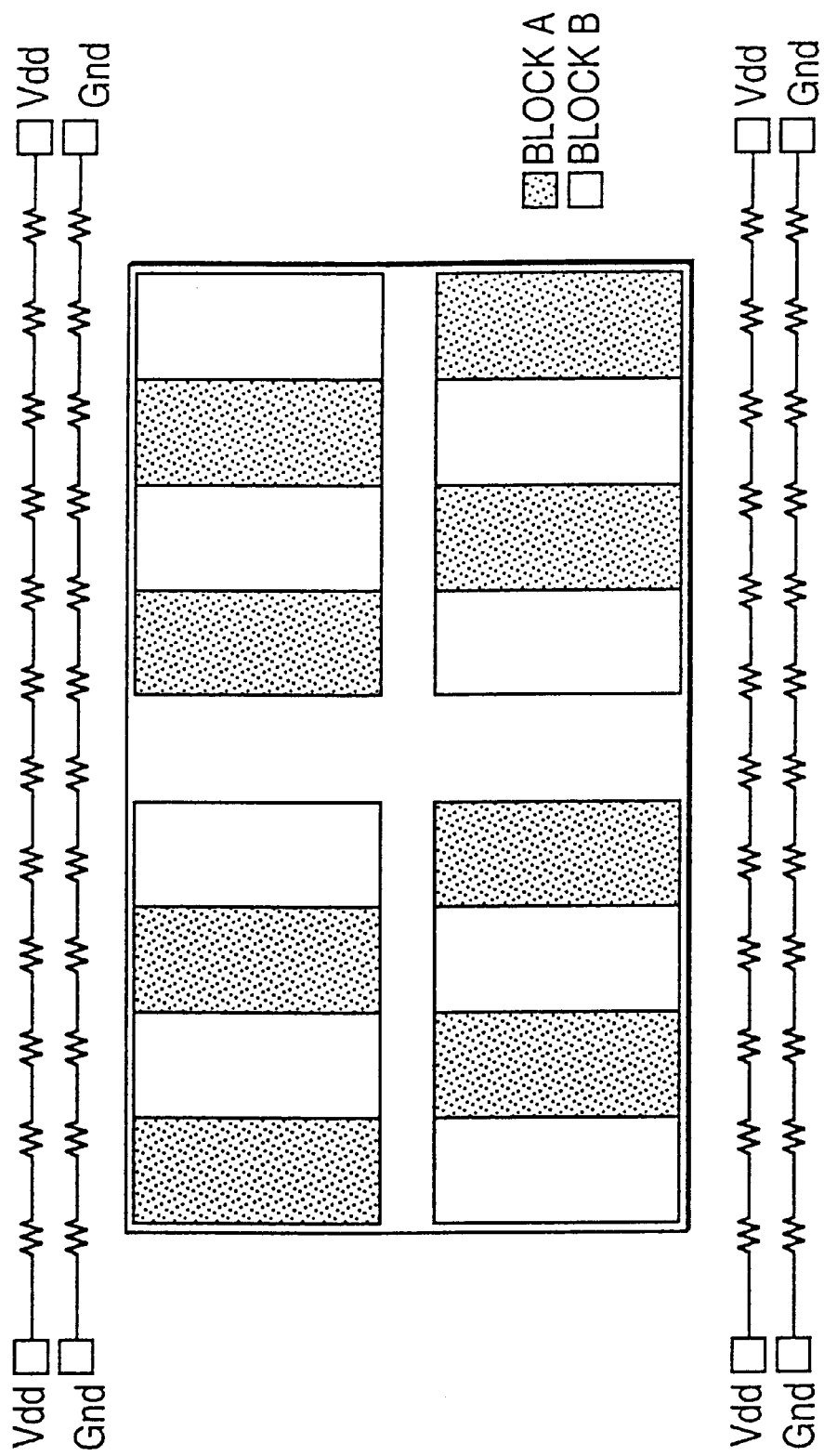
FIG. 10 is a view depicting the semiconductor memory device shown in FIG. 8.

The present embodiment is similar in basic configuration to the first embodiment. In the present embodiment, however, respective sub-array regions are further divided into a plurality of small sub-array regions and a plurality of non-adjoining small sub-array regions in the respective sub-array regions are set as simultaneously-activated arrays, i.e., one block in order to effectively reduce power source noise and increase the amplifying speed of each sense amplifier. FIG. 9 shows a specific example 1 in which the respective sub-array regions are respectively divided into two small sub-array regions. FIG. 10 illustrates a specific example 2 in which the respective sub-array regions are respectively divided into four small sub-array regions.

Figure 7:
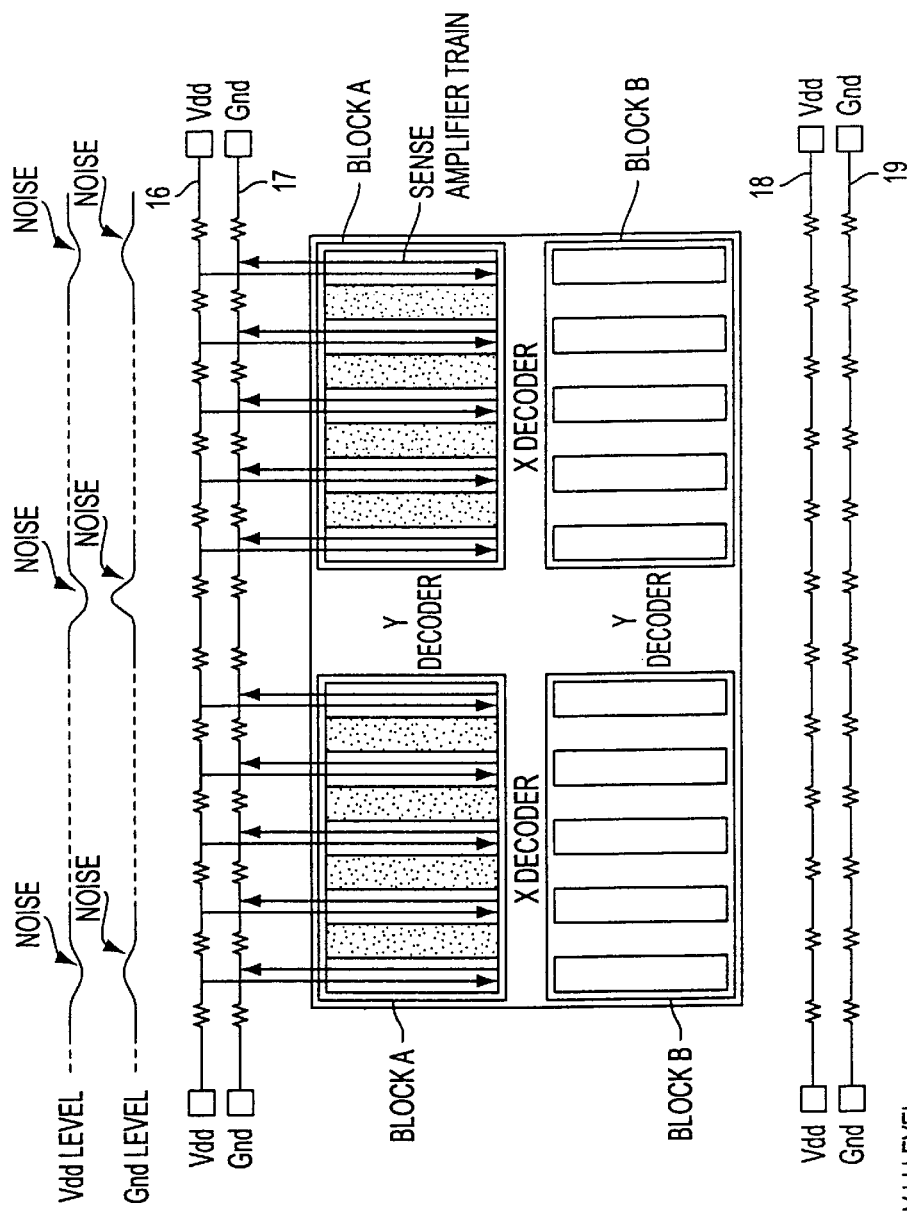
FIG. 7 is a view for describing noise produced in source interconnections at the time of the operation of the semiconductor memory device shown in FIG. 3.

Since the second embodiment is identical in operation to the first embodiment, the description of its operation will be omitted. Now consider noise produced in source interconnections when a block A is activated by way of example. In a conventional circuit, noise sources are biased to source interconnections 16 and 17 on the upper side as shown in FIG. 7. In the first embodiment, noise sources are biased toward the neighborhood of the left pads for the upper source interconnections 56 and 57 and the neighborhood of the right pads for the lower source interconnections 58 and 59 as shown in FIG. 2. However, since the simultaneously-activated sub-array regions are respectively divided into the blocks in grid form in the second embodiment, the noise sources referred to above are not biased. Further, since the noise sources are dispersed over the entire chip, the source interconnections can be efficiently used.

It is thus possible to effectively reduce the noise and provide uniform power consumption. The speed of amplifying information by each sense amplifier can be made faster than ever.

A third embodiment of the present invention will next be described.

Figure 11:
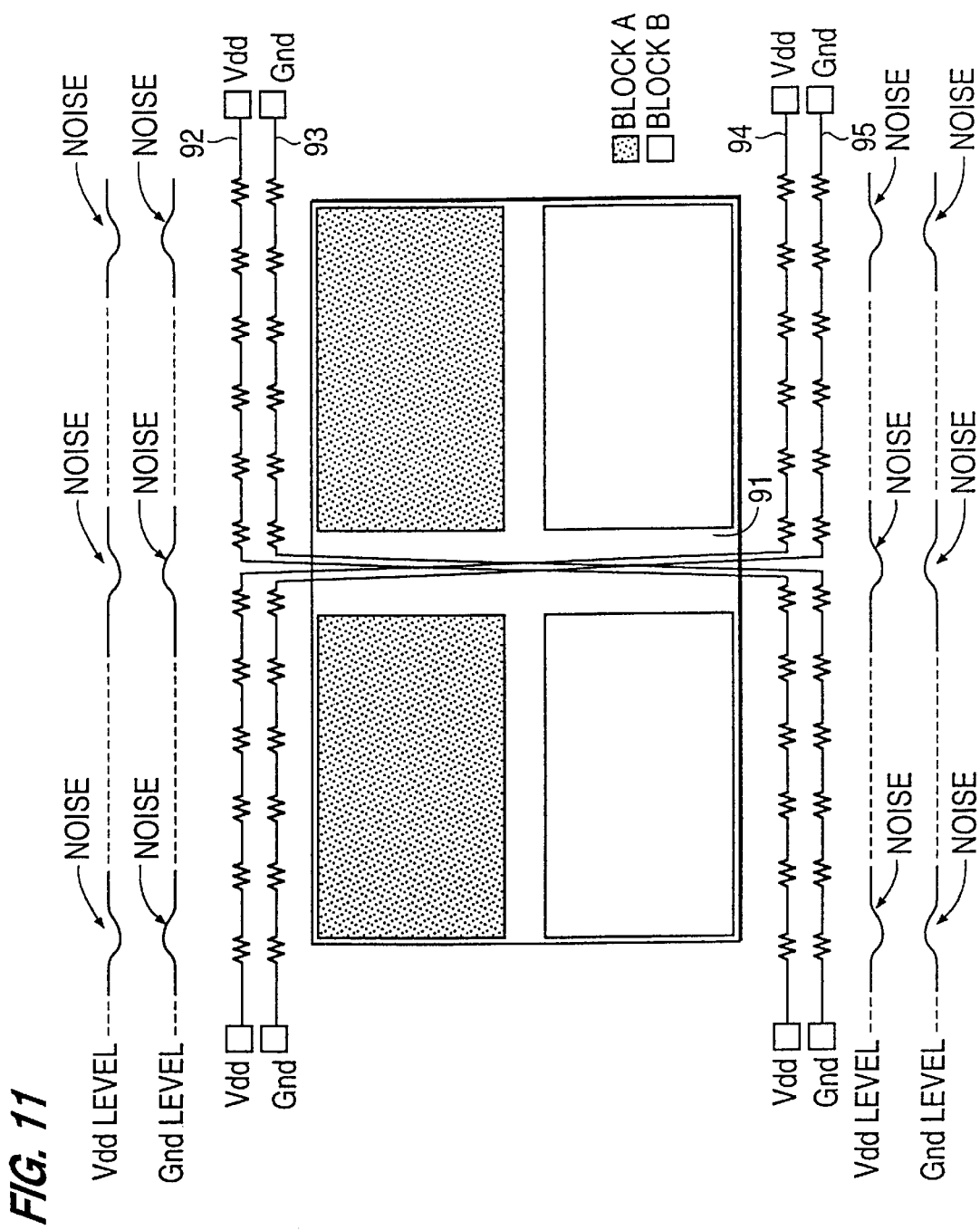
FIG. 11 is a view showing a semiconductor memory device according to a third embodiment of the present invention.

FIG. 11 is a view showing the structure of a block-splitting mode of a semiconductor memory device illustrating the third embodiment of the present invention.

The third embodiment is identical in basic configuration to the prior art. In the present embodiment, however, source interconnections 92 and 93 and source interconnections 94 and 95 are provided so as to intersect at regions 91 defined between right sub-array regions and left sub-array regions.

Since the semiconductor memory device according to the present embodiment is identical in operation to that according to the first embodiment, the description of its operation will be omitted.

According to the third embodiment, noise sources can be dispersed so as to reduce power source noise by performing only a change in the layout of the source interconnections without a change in circuit configuration.

Thus, the speed of amplifying information by each sense amplifier can be rendered faster than ever and access times to a chip will eventually lead to speeding-up.

A fourth embodiment of the present invention will next be described.

Figure 12:
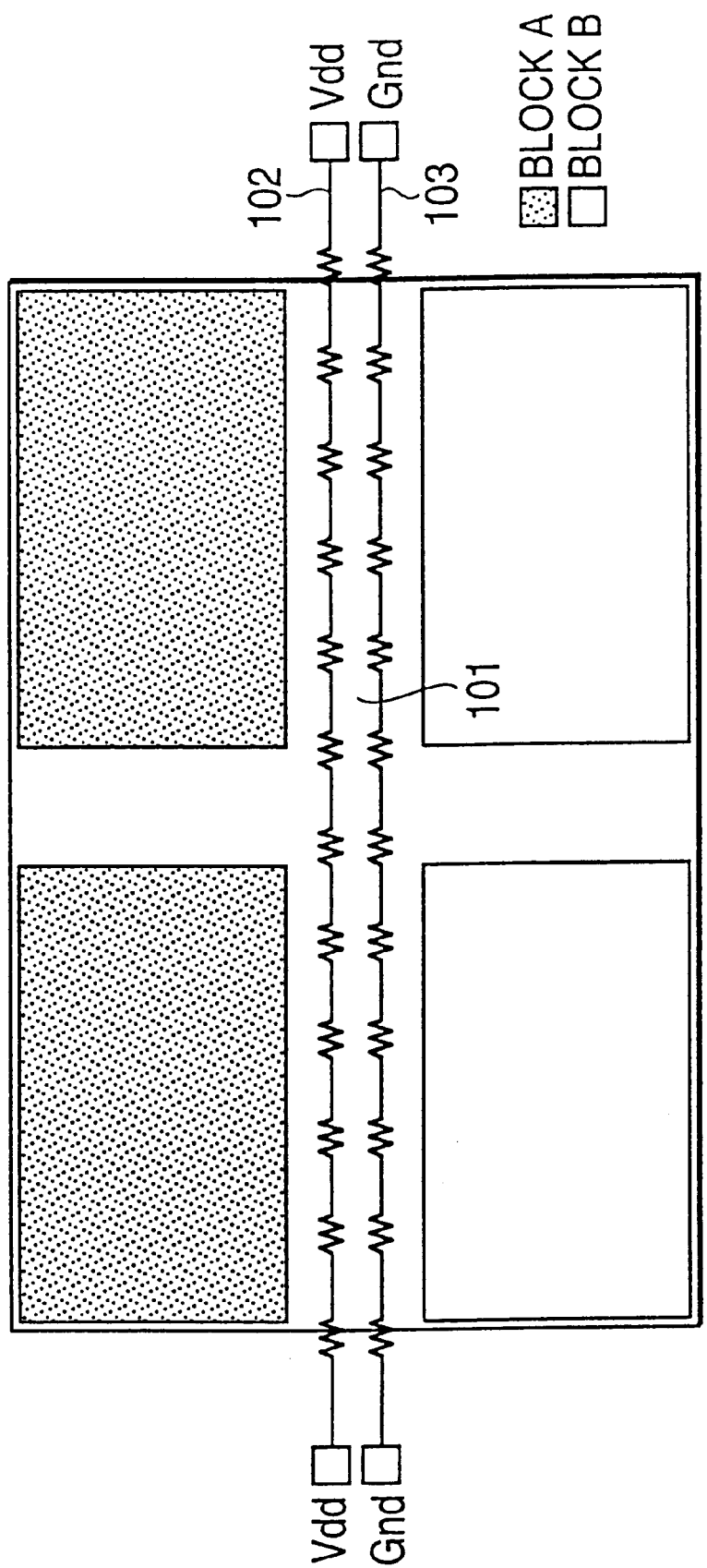
FIG. 12 is a view illustrating a semiconductor memory device according to a fourth embodiment of the present invention.

FIG. 12 is a view typically showing a block-splitting mode of a semiconductor memory device illustrative of the fourth embodiment of the present invention.

The fourth embodiment is similar in basic configuration to the prior art. In the present embodiment, however, the source interconnections, which have been disposed along the peripheral edges of the respective sub-array regions, are eliminated and combined into one (with the width between the interconnections defined as twice the above width). Namely, they are disposed within a region 101 defined between the upper sub-array regions and the lower sub-array regions. The source interconnections are shared between the sub-array regions on the upper and lower sides.

Figure 13:
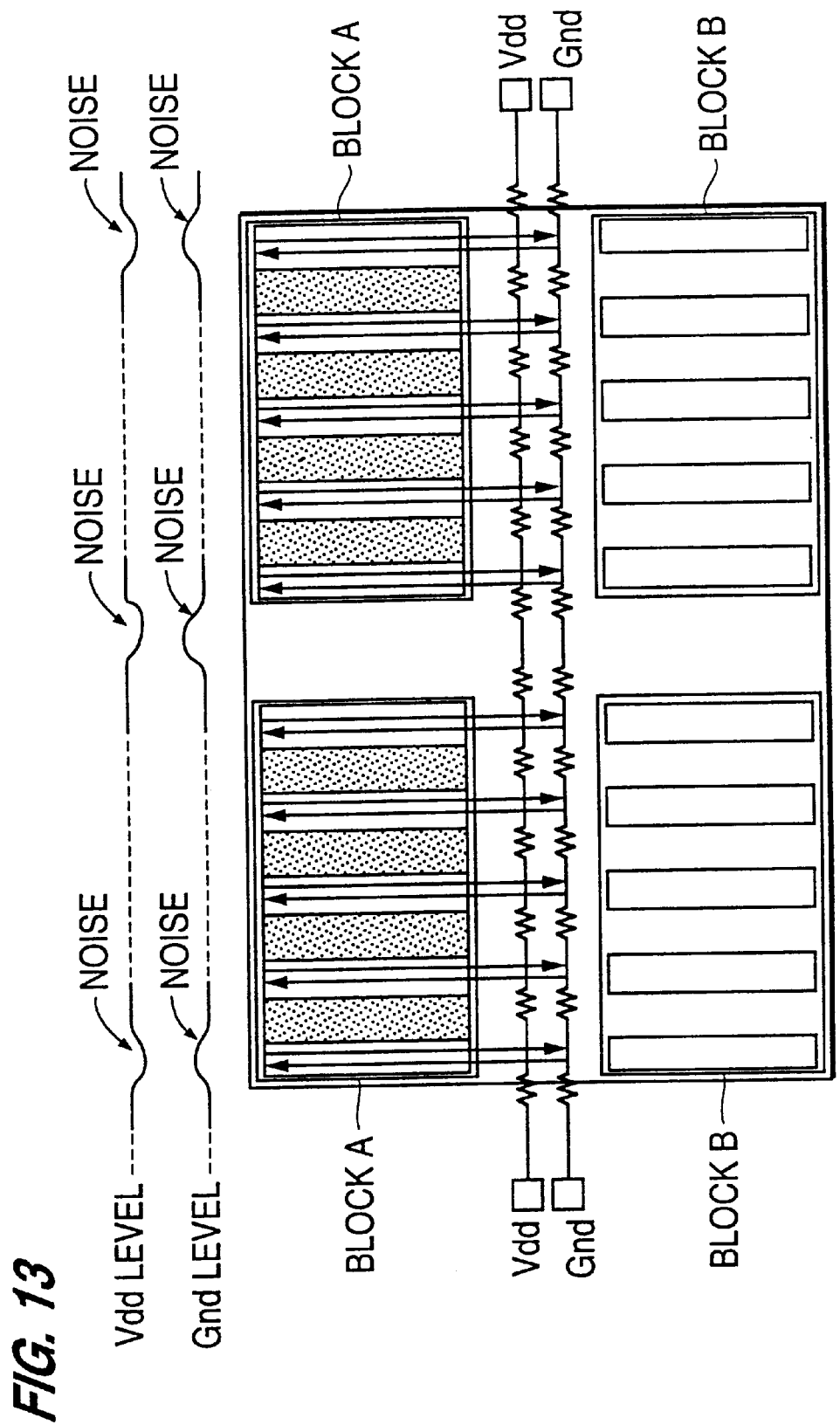
FIG. 13 is a view depicting the semiconductor memory device shown in FIG. 12.

The present embodiment is identical in basic operation to the prior art. However, since the source interconnections 102 and 103 are placed within the region 101 alone, electric charges are charged or discharged as shown in FIG. 13.

Since the noise sources are biased toward the upper or lower power sources in the conventional circuit, the power sources lying on the opposite side thereof were not used.

According to the fourth embodiment, the integration of the upper and lower source interconnections into one and the placement of them in the region 101 will allow the source interconnections to be efficiently used without a change in chip size. It is thus possible to obtain the effect of reducing noise in a manner similar to the first and third embodiments.

Incidentally, the present invention is not necessarily limited to the above-described embodiments. It is needless to say that various changes and modifications can be made based on the spirit of the present invention and will not be excluded from the scope of the present invention.

According to the present invention as has been described in detail above, the following advantageous effects can be brought about.

(1) Since simultaneously-activated sub-array regions are divided into blocks in cross form, noise sources, which have heretofore been biased toward upper or lower source interconnections, can be distributed into upper and lower portions on the left and right sides. It is therefore possible to reduce noise as compared with the prior art.

Thus, the speed of amplifying information by each sense amplifier can be rendered faster than ever and access times to a chip can be eventually made faster.

(2) Since simultaneously-activated sub-array regions are divided into blocks in grid form, noise sources are prevented from biasing. Further, since the sub-array regions are dispersed over the entire chip, source interconnections can be efficiently used.

Thus, noise can be effectively reduced and uniform power consumption can be achieved. Further, the speed of amplifying information by each sense amplifier can be rendered higher than ever.

(3) By making only a change in layout of source interconnections without a change in circuit or circuit configuration, noise sources can be dispersed so as to reduce power source noise.

Thus, the speed of amplifying information by each sense amplifier can be rendered faster than ever and access times to a chip can be eventually faster.

(4) By integrating upper and lower source interconnections into one and disposing it in a predetermined region, the source interconnections can be efficiently used without a change in chip size, thus producing a noise-reduction effect.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor memory device comprising:
a semiconductor chip having first through fourth sides;
a first interconnection disposed along the first side of said semiconductor chip and supplied with a source potential level or a ground potential level;
a second interconnection disposed along the second side opposed to the first side and supplied with the source potential level or the ground potential level; and
a plurality of sub-array regions disposed between said first interconnection and said second interconnection, said each sub-array region including a plurality of memory cells and a plurality of sense amplifiers respectively connected to said memory cells, said memory cells and said sense amplifiers being disposed in each of said sub-array regions,
said sense amplifiers disposed in one of said sub-array regions being activated in response to the potential level supplied to said first interconnection,
said sense amplifiers disposed in another one of said sub-array regions being activated substantially simultaneously with said sense amplifiers disposed in said one of said sub-array regions in response to the potential level supplied to said second interconnection.

2. A semiconductor memory device as claimed in claim 1, wherein said each sub-array region comprises,
first and second sub-array regions disposed along the first side,
third and fourth sub-array regions disposed along the second side,
sense amplifiers disposed in said first sub-array region are activated in response to the potential level supplied to said first interconnection during a first time,
said sense amplifiers disposed in said third sub-array region are activated in response to the potential level supplied to said second interconnection during the first time,
said sense amplifiers disposed in said second sub-array region are activated in response to the potential level supplied to said first interconnection during a second time, and
said sense amplifiers disposed in said fourth sub-array region are activated in response to the potential level supplied to said second interconnection during the second time.

3. A semiconductor memory device as claimed in claim 2, wherein said first sub-array region and said third sub-array region are disposed in positions symmetrical relative to each other with respect to a point on said semiconductor chip.

4. A semiconductor memory device as claimed in claim 2, wherein said sense amplifiers disposed in said first sub-array region, which are activated during the first time, are respectively about half of the number of said sense amplifiers disposed in said first sub-array region.

5. A semiconductor memory device as claimed in claim 4, wherein said activated sense amplifiers each corresponding to said about half the number of said sense amplifiers are disposed within each sub-array region in grid form.

6. A semiconductor memory device as claimed in claim 2, wherein said sense amplifier disposed in said first sub-array region, which are activated during the first time, are disposed on the side of the third side of said semiconductor chip, and said sense amplifiers disposed in said first sub-array region, which are activated during the second time, are disposed on the side of the fourth side of said semiconductor chip.

7. A semiconductor memory device as claimed in claim 2, wherein said sense amplifiers disposed in said first sub-array region, which are activated during the first time, and said sense amplifiers disposed in said first sub-array region, which are activated during the second time, are respectively alternately disposed so as to extend from the third side to the fourth side.

8. A semiconductor memory device comprising:
a semiconductor chip having a first side, a second side and a third side both adjacent to the first side, and a fourth side opposed to the first side;
a first interconnection disposed along the first side on the side of said second side and supplied with a source potential level or a ground potential level;
a second interconnection disposed along the first side on the side of said third side and supplied with the source potential level or the ground potential level;
a third interconnection disposed along the fourth side on the side of said second side and supplied with the source potential level or the ground potential level;
a fourth interconnection disposed along the fourth side on the side of said third side and supplied with the source potential level or the ground potential level;
a fifth interconnection formed on said semiconductor chip and connecting said first interconnection and said fourth interconnection to one another;
a sixth interconnection formed on said semiconductor chip and connecting said second interconnection and said third interconnection to one another; and
a plurality of sub-array regions disposed on said semiconductor chip, said each sub-array region including a plurality of memory cells and a plurality of sense amplifiers respectively connected to said plurality of memory cells, said memory cells and said sense amplifiers being disposed in said each sub-array region,
said sense amplifiers disposed in one of said plurality of sub-array regions being activated in response to the potential level supplied to said first interconnection,
said sense amplifiers disposed in another one of said plurality of sub-array regions being activated substantially simultaneously with said sense amplifiers disposed in said one of said plurality of sub-array regions in response to the potential level supplied to said second interconnection.

9. A semiconductor memory device as claimed in claim 8, wherein said each sub-array region comprises,
a first sub-array region disposed along said first interconnection,
a second sub-array region disposed along said second interconnection,
a third sub-array region disposed along said third interconnection, and
a fourth sub-array region disposed along said fourth interconnection and wherein
said sense amplifiers disposed in said first sub-array region are activated in response to the potential level supplied to said first interconnection during a first time,
said sense amplifiers disposed in said second sub-array region are activated in response to the potential level supplied to said second interconnection during the first time, said sense amplifiers disposed in said third sub-array region are activated in response to the potential level supplied to said third interconnection during a second time, and said sense amplifiers disposed in said fourth sub-array region are activated in response to the potential level supplied to said fourth interconnection during the second time.

10. A semiconductor memory device comprising:

a semiconductor chip having a first side, a second side and a third side both adjacent to the first side, and a fourth side opposed to the first side;

at least one source interconnection extending from a substantially middle point of the second side to a substantially middle point of the third side and supplied with a source potential level or a ground potential level;

first and second sub-array regions disposed along the first side, said each sub-array region being provided therewithin with a plurality of memory cells and a plurality of sense amplifiers respectively connected to said memory cells; and third and fourth sub-array regions disposed along the fourth side, said each sub-array region being provided therewithin with a plurality of memory cells and a plurality of sense amplifiers respectively connected to said memory cells, said sense amplifiers disposed in said first and second sub-array regions being activated substantially simultaneously in response to the potential level supplied to said source interconnection.

11. A semiconductor memory device as claimed in claim 10, wherein said sense amplifiers disposed in said first and second sub-array regions are activated during a first time and said sense amplifiers disposed in said third and fourth sub-array regions are activated in response to the potential level supplied to said source interconnection during a second time.

12. A semiconductor memory device comprising:

a semiconductor chip having a first side, a second side and a third side both adjacent to said first side, and a fourth side opposite said first side;

a first interconnection disposed between said second and third sides and supplied with one of a source potential level and a ground potential level;

a first sub-array region disposed adjacent said first and second sides, coupled to said first interconnection, and comprising a plurality of memory cells and a plurality of sense amplifiers;

a second sub-array region coupled to said first interconnection and comprising a plurality of memory cells and a plurality of sense amplifiers;

a third sub-array region disposed adjacent said second and fourth sides and comprising a plurality of memory cells and a plurality of sense amplifiers; said sense amplifiers of said first sub-array region being activated substantially simultaneously in response to the potential level supplied to said first interconnection during a first time; and said sense amplifiers of said second and third sub-array regions being activated substantially simultaneously in response to the potential level supplied to said first interconnection during a second time.

13. A semiconductor memory device as claimed in claim 12, wherein said second sub-array region is disposed adjacent said first and third sides.

14. A semiconductor memory device as claimed in claim 12, wherein said second sub-array region is disposed adjacent said first side and said first sub-array region.

15. A semiconductor memory device as claimed in claim 12, further comprising:

a second interconnection disposed between said second and third sides and adjacent to said fourth side, and supplied with one of a source potential level and a ground potential level;

wherein said first interconnection is further disposed adjacent said first side.

16. A semiconductor memory device as claimed in claim 12, wherein said second sub-array region is disposed adjacent said third and fourth sides.

17. A semiconductor memory device as claimed in claim 12, further comprising:

a second interconnection disposed between said second and third sides, adjacent said fourth side, crossing said semiconductor chip, and adjacent said first side, said second interconnection being supplied with one of a source potential level and a ground potential level, said second interconnection being coupled to said third sub-array region;

wherein said first interconnection is further disposed adjacent said first side, crossing said semiconductor chip, and adjacent said fourth side.

18. A semiconductor memory device as claimed in claim 12, wherein said first interconnection extends from a substantially middle point of said second side to a substantially middle point of said third side; wherein said third sub-array is coupled to said first interconnection.

* * * * *